AMPLIFYING SYSTEM HAVING HIGH SPEED AND
HIGH ACCURACY GAIN CONTROL
Filed July 31, 1964
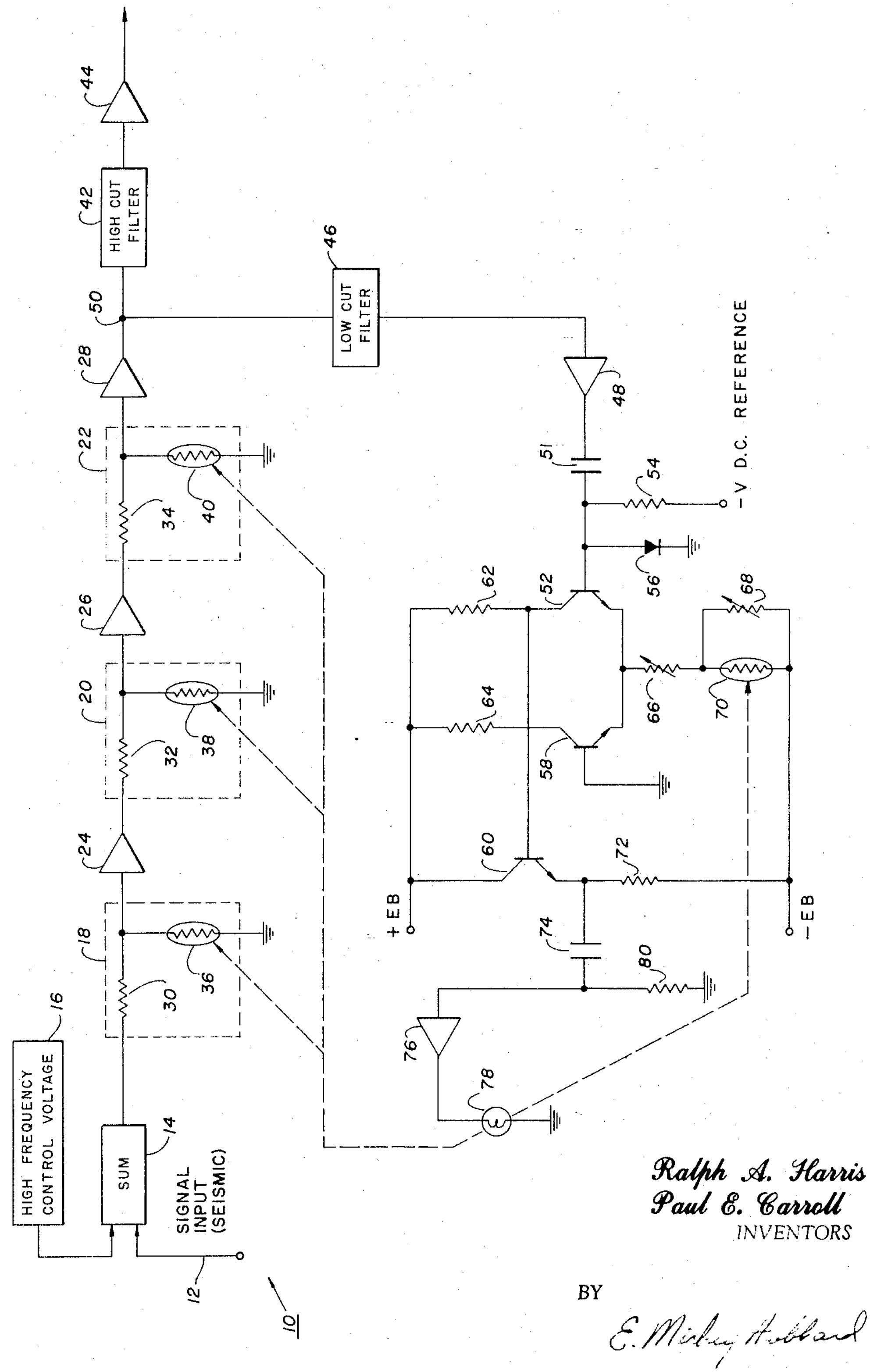
Ralph A. Harris
Paul E. Carroll
INVENTORS
BY
E. Mickey Hubbard 3,360,737
AMPLIFYING SYSTEM HAVING HIGH SPEED AND HIGH ACCURACY GAIN CONTROL Ralph A. Harris and Paul E. Carroll, Houston, Tex., assignors to Texas Instruments Incorporated, Dallas, Tex., a corporation of Delaware Filed July 31, 1964, Ser. No. 386,630
4 Claims. (Cl. 330—52)

ABSTRACT OF THE DISCLOSURE

An amplifying system is disclosed for controlling the gain of an amplifier utilizing an electro-optical gain feedback loop and resulting in high speed and highly accurate gain control. The gain control loop operates in response to a high frequency control signal which is introduced at the input of the amplifying system along with the signal of interest to be amplified, so as to maintain the amplitude of the control signal at the output of the amplifying system at a constant value.

The present invention relates to methods for controlling gain, and more particularly relates to an improved method and system for accurately controlling the gain of an amplifier by a high frequency voltage which varies in a predetermined manner, such as at a predetermined rate with respect to time.

U.S. Patent No. 3,083,341 discloses a system for controlling the gain of a plurality of seismic amplifiers by means of a high frequency A.C. control voltage. As used herein, the term "high frequency" means a frequency substantially above or otherwise outside the frequency band of interest. It is highly desirable to vary the gain of a seismic amplifier in a predetermined manner with respect to time so that the actual amplitude of the seismic signal can be determined. However, it is difficult to achieve a time-varied gain with an acceptable degree of accuracy because first, it is difficult to accurately produce a time-varied high frequency control voltage, and second, it is difficult to accurately relate the gain of an amplifier to the control signal over the necessary wide dynamic range.

In copending U.S. application Ser. No. 386,631, entitled "Method and Apparatus for Controlling Gain of an Amplifier," filed by Harris et al. on even date herewith, and assigned to the assignee of the present invention, a system for accurately producing a high frequency A.C. control voltage having an exponentially decreasing or time-varied ampltiude is described and claimed.

The problem of producing an amplifier system which will accurately follow the A.C. control voltage arises primarily because the automatic gain control loops of most amplifiers are designed for low frequencies. In such a low frequency loop, the design objectives are to hold the output variation to a small range (3 to 6 db) for a wide range of input signal levels (from 80 to 100 db), and to have a slow action so as not to greatly distort the low frequency signals. Both of these design objectives are detrimental to accuracy of gain. The low frequencies are prevented from operating the gain control loop, and the small variation of high frequency output with respect to the high frequency input prevents there being an accurate relationship between the amplitude level of the high frequency and the gain of the amplifier. The slow speed of the gain control loop further complicates the problem by introducing an unknown time lag between the change in amplitude in the high frequency control voltage and the resulting change in gain. This problem can be reduced somewhat by making the time-constant of the gain control small, but it is nevertheless necessary to use sufficient filtering in the gain control circuit rectifier to reduce the ripple, and this limits the speed that can be obtained in the loop.

The present invention is concerned with a method for controlling the gain of an amplifier system whereby the gain of the system may be made to accurately follow the amplitude of a high frequency control voltage in inverse relationship so that when the method is used in combination with the method described in the above-referenced application for producing an accurate time-varied high frequency control voltage, a very accurately controlled time-varied gain can be accomplished. It is to be understood, however, that any suitable method for producing an accurate high frequency control voltage may be employed in combination with the present invention if desired.

In accordance with the broader aspects of the present invention, the control frequency in the output is accurately maintained at a preselected level relative to a stable D.C. reference voltage so that the gain of the amplifier will be inversely proportional to the amplitude of the high frequency control voltage injected into the amplifier system. More specifically, the invention contemplates an automatic gain control loop in which the high frequency control voltage in the output is compared with a D.C. reference voltage and the gain of the system automatically adjusted to maintain the output control voltage frequency at a constant amplitude. With the high frequency output voltage maintained constant, the gain of the system is then simply the reciprocal of the high frequency input voltage.

In accordance with a more specific aspect of the invention, the output from the amplifier is first passed through a low cut filter. The amplitude of the remaining high frequency is then compared to a D.C. reference voltage. The difference is detected and amplified to produce an error signal which drives a series of attenuators alternately disposed between cascaded amplifiers to vary the total gain of the amplifier. Additional more specific aspects of the system will hereafter be described in greater detail and more particularly pointed out in the appended claims.

Therefore an important object of the present invention is to provide an amplifier system which has an accurately controllable gain.

A further object is to provide a system of the type described wherein the lag in the gain of the amplifier behind variations in the high frequency control voltage is held to a minimum.

A still further object of the invention is to provide an improved gain control loop which may be accurately controlled by the amplitude of an A.C. voltage having a frequency other than the frequency of interest.

Another object of the invention is to provide an automatic gain control loop of the type described wherein the usual resistor-capacitor filter is eliminated so as to increase the speed of the loop.

Additional objects and advantages of the present invention will be evident to those skilled in the art from the following detailed description and drawing, wherein:

The figure is a schematic diagram of a system constructed in accordance with the present invention.

Referring now to the drawing, a system constructed in accordance with the present invention is indicated generally by the reference numeral 10. The input signal, such as the signal from a seismometer, is applied through lead 12 to a summing network 14. In seismographic applications, an input amplifier stage and suitable band setting filters (which are not illustrated) will normally be connected between the seismometers and the summing circuit 14. A high frequency control voltage source 16, such as in the system disclosed in the above-referenced application, is also connected to the summing network 14 which adds the two input voltage signals in a linear manner. Any number of different summing networks known in the art may be used for this purpose. The seismic frequencies will generally be between about 5 and 300 c.p.s., and the control voltage frequency may be any frequency substantially above this. In one particular embodiment the high frequency control voltage is 3250 c.p.s.

The output from the summing network 14 is applied to a series of cascaded attenuators 18, 20 and 22 and amplifiers 24, 26 and 28. The attenuators 18, 20 and 22 are of identical construction and each includes a series resistor, resistors 30, 32 and 34, respectively, and a variable shunt resistor, such as the photoconductive cells 36, 38 and 40, respectively. The conductance of the photoconductive cells varies directly with the degree of illumination from a very low value to a very high value. The amount of gain of each of the amplifiers 24, 26 and 28 is determined by the maximum gain the system must have, the loss in the attenuators, and the number of cascaded stages of attenuators and amplifiers. In the particular embodiment heretofore mentioned, each of the amplifiers has a gain of 32 db. Each of the amplifiers 24, 26 and 28 should also contain means to prevent overloading as a result of large magnitude signals and should have means to limit the low frequency response of each. The output of the third amplifier 28 is fed to a high cut filter 42 which removes the high frequency control voltage from the signal. The output of the filter 42 is fed to a unity-gain buffer amplifier 44 which has a high input impedance and enough power to drive the load, which can be a magnetic recorder, mirror galvanometer, or other device.

The output of the third amplifier 28 is also fed to a gain control loop comprised of a low cut filter 46 which removes the low frequency seismic signals and passes the high frequency of the gain control voltage. It is necessary for the filter 46 to thoroughly remove all of the low frequency signals of interest, or small changes in the gain of the system will result which will distort the wave form of the low frequency signals. The output of the low cut filter 46 is fed to an amplifier 48 which has a small amount of gain determined by the high frequency voltage level to be maintained at junction 50 and the level of the D.C. reference voltage to be used in the gain control loop as hereafter described. In the specific embodiment referred to, the high frequency control voltage at junction 50 was maintained at one volt RMS, the D.C. reference voltage was −3 v. D.C., and the gain of the amplifier 48 was about 6 db.

The output of the amplifier 48 is A.C. coupled through capacitor 51 to the base of a transistor 52. The transistor 52 together with a transistor 58 form a difference pair amplifier with the bases of the two transistors constituting the inputs. A negative D.C. reference voltage is applied across the inputs of the difference pair amplifier through the resistor 54 because the base of transistor 58 is connected to ground. A back-biased diode 56 is provided to prevent overloading of the difference pair amplifier. The collector of transistor 52 is connected through resistor 62 to a positive supply voltage +EB, and the collector of transistor 58 is connected to the supply voltage through resistor 64. The emitters of transistors 52 and 58 are connected to a negative supply voltage EB by a variable resistance comprised of variable resistors 66 and 68 and photoconductive cell 70. In the particular embodiment referenced above, the supply voltages are +12 volts and −12 volts with respect to ground. The conductance of the photoconductive cell 70 varies directly with the intensity of illumination, the conductance being a minimum when the cell is in darkness and a maximum when brightly illuminated. The variable resistors 66 and 68 and the photoconductive cell 70 control the emitter current of the transistors 52 and 58 as will presently be described. The collector of transistor 52 is connected to the base of a transistor 60. The collector of transistor 60 is connected to the positive voltage supply +EB and the emitter is connected through resistor 72 to the negative supply voltage −EB. The transistors 52, 58 and 60 form a comparator amplifier which compares the A.C. voltage from the amplifier 48 with the D.C. reference voltage and produces an error signal related to the difference as will hereafter be described in greater detail.

The emitter of transistor 60 is A.C. coupled through capacitor 74 to a unity-gain amplifier 76 having a sufficient current output to operate a lamp 78. A resistor 80 connects the input of the amplifier 76 to ground to provide an input voltage. The lamp 78 illuminates the photoconductive cells 36, 38 and 40 of the attenuators 18, 20 and 22, respectively, and the photoconductive cell 70 of the emitter current control resistance of the comparator network.

*Operation*

In the operation of the system 10, the high frequency control voltage and the signal input voltage are summed and passed through the series of cascaded attenuators and amplifiers where both frequencies are amplified to the same degree. The signal input is then separated by the high cut filter 42 and fed to the output amplifier 44. The high frequency of the control voltage is passed through the low cut filter 46, amplified by the amplifier 48 and applied to the base of the transistor 52 of the comparator amplifier. Since the negative reference voltage is connected across the inputs of the comparator amplifier so as to back-bias the transistor 52, the comparator amplifier will produce no output except when the applied A.C. voltage exceeds the negative reference voltage applied so as to forward-bias the base of the transistor 52.

So long as the base of the transistor 52 is negative, the collector voltage of transistor 52 is substantially equal to the positive supply voltage +EB so that the base and emitter of the transistor 60 are also substantially at the positive supply voltage. When the positive half-cycle of the high frequency control voltage exceeds the negative reference voltage so as to apply a positive bias to the base of transistor 52, transistor 52 conducts current and its collector becomes more negative so that the emitter of transistor 60 also moves negatively. This results in a negative pulse being applied to the amplifier 76 which drives the lamp 78. The lamp 78 illuminates the photoconductive cells 36, 38 and 40 so as to increase the conductance of each and thereby increase the attenuation of both the low and high frequencies. Thus as the amplitude of the high frequency control voltage at junction 50 increases, the error signal output from the comparator network increases, the brilliance of the lamp 78 increases, the conductance of the cells 36, 38 and 40 increases, and the degree of attenuation increases thereby tending to maintain the amplitude of high frequency control voltage at junction 50 at a constant level. The toal gain of the amplifier system comprised of the cascaded amplifiers and attenuators is the output divided by the input. Therefore if the output of the high frequency control voltage is held constant, the total gain of the amplifier system will be inversely proportional to the amplitude of the high frequency control voltage at the input.

It will be noted that the output from the comparator network is dependent upon the extent to which the amplitude of the high frequency control voltage applied to the base of transistor 52 exceeds the negative D.C. reference voltage applied to the base of the transistor through resistor 54. The output of the comparator network is thus an amplification of the positive peaks of the high frequency wave form, with a polarity reversal due to the transistor 52 so that the output is a series of negative pulses. Since the high frequency control voltage is a sine wave, both the amplitude and width of the pulses will vary depending upon the amplitude of the positive peaks of the high frequency control voltage. If the high frequency control voltage peaks exceed the reference D.C. voltage by a significant amount, the diode 56 limits the amplitude of the pulses which then become width-modulated as a result of the period of time the peak of the voltage exceeds the reference voltage. On the other hand, if the peak of the high frequency control voltage drops below the negative D.C. reference voltage, the comparator produces no output voltage. Both of these conditions are transient. Normally there is a negative output pulse for each positive peak, and the pulse amplitude and width are determined by the magnitude of the positive peak, with the comparator amplifier acting as a linear amplifier during the pulse.

The amplitude of the output pulses from the comparator can nevertheless be relatively large. In the embodiment previously referenced, for example, the amplitude of the pulses may exceed 8 volts. In that embodiment the lamp 78 is rated at about 2.7 volts, so that approximately three times normal voltage and over nine times normal power can be delivered to the lamp. The total average power of the pulses to the lamp does not exceed the lamp rating, however, and a suitable means is provided in the amplifier 76 to prevent the average power from exceeding the rated power of the lamp. By operating the lamp from the high voltage and high power pulses, the lamp is turned on very fast. Therefore a very fast-acting gain control loop is obtained because the only time-constants involved are the thermal time-constants of the lamp and of the photoconductive cells of the attenuators. High speed photoconductor cells are used so that the only significant thermal time-constant is that of the lamp 78.

In the embodiment of the system previously mentioned, the total gain can be varied over a 100 db range with good acuracy. When the system is operating at high gain, i.e., the lamp 78 is dim, the total gain around the gain control loop is sufficiently great to cause sustained hunting. For example, one large pulse applied to the lamp can so increase the degree of attenuation that the next several pulses will be missing from the output of the comparator amplifier. This problem is compensated by varying the gain of the comparator amplifier in direct relation to its gain by means of the resistor network connecting the emitters of the transistor pair 52 and 58 to the negative supply voltage. The maximum voltage pulse which can be developed across resistor 62 is determined by the maximum collector current of transistor 52, and therefore by the maximum emitter current. For a minimum gain condition, that is, when the lamp 78 is bright, the photoconductive cell 70 has a very low resistance value. Therefore, the emitter current is limited, in effect, only by resistor 66. At maximum gain condition, the lamp 78 is dimly lit and the resistance of the photoconductive cell is very high, so that the emitter current is limited by both the resistor 66 and resistor 68. Thus, when the total gain of the amplifiers is a minimum, the gain of the comparator amplifier is at a maximum, and when the total gain of the amplifier is at a maximum, the gain of the comparator network is at a minimum. The photoconductive cell 70 functions as an automatic gain control which prevents the total loop gain of the system from varying over drastic limits so that stable operation can be attained.

When operating the system 10 with the system described in the above-referenced application, the amplitude of the high frequency control voltage is initially at a high level, then exponentially declines at a predetermined rate to a predetermined low level. When the high frequency control voltage is at the initial high level, the peaks of the control voltage will exceed the negative D.C. reference voltage at the base of transistor 52 to a marked degree so that a maximum error signal will be produced by the comparator amplifier. The lamp 78 will therefore be at maximum brilliance, the photoconductor cells will be at maximum conductance, and the degree of attenuation will be at a maximum so that the total gain of the system will be at a minimum. As the amplitude of the high frequency control voltage decreases, the automatic gain control loop will tend to maintain the amplitude of the high frequency voltage signal at junction 50 constant. A slight decrease in the high frequency control voltage at junction 50 relative to the D.C. reference voltage will be detected and amplified to reduce the error signal, the lamp 78 will grow dimmer, and the degree of attenuation will be decrease to maintain the amplitude of the high frequency voltage at junction 50 substantially constant. The total gain of the system will therefore be increased until the amplitude of the high frequency control voltage at the input is at the final low value, and the gain of the system 10 at a final high value.

From the above described embodiment of the invention, it will be evident to those skilled in the art that a novel and useful method and system for controlling the gain of an amplifier has been described. The method and system is particularly suited for use in combination with the system described in the above-referenced application for producing a high frequency control voltage that initially varies automatically with the average gain of a plurality of amplifiers, then decreases at an exponential or other time-varied rate to a resulting low value. It will be appreciated that the system 10 may be fabricated using the other type of transistors, vacuum tubes, and equivalent components without departing from the invention.

Although a preferred embodiment of the invention has been described in detail, it is to be understood that various changes, substitutions and alterations can be made therein without departing from the spirit and scope of the invention as defined by the appended claims.

What is claimed is:

1. A system for controlling the gain of an amplifier, comprising:

means for producing an AC control voltage having a frequency outside the frequency band of interest and having a selectively variable amplitude, means for applying said control voltage to said amplifier, means for selectively sensing only the amplitude of the AC control voltage frequency in the output of said amplifier, a second amplifier for amplifying the sensed frequency, a comparator amplifier having a pair of inputs, one of which is AC coupled to the output of the second amplifier, a DC reference voltage source, means for applying the DC reference voltage from said DC reference voltage source across the pair of inputs to the comparator amplifier, whereby only that portion of the half-cycles of the AC control voltage frequency applied to the comparator amplifier which exceeds the reference voltage will be amplified by the comparator amplifier to produce an error signal, means for applying the error signal to said amplifier, and means in said amplifier for varying the gain thereof responsive to said error signal in a direction tending to maintain the amplitude of the AC control voltage frequency in the output of said amplifier at a constant level, whereby the gain of the amplifier will be inversely proportional to the amplitude of the AC control voltage.

2. A system as defined in claim 1 wherein the comparator amplifier is further characterized by:

means for causing the gain of the comparator amplifier to vary inversely with the gain of the amplifier being controlled.

3. A system for controlling the gain of an amplifier, comprising:

means for producing an AC control voltage having a frequency outside the frequency band of interest and having a selectively variable amplitude, means for applying said control voltage to said amplifier, means for selectively sensing only the amplitude of the AC control voltage frequency in the output of said amplifier, a difference pair amplifier comprised of first and second transistors, the collectors of which are connected through separate resistors to a collector voltage supply, the emitters of which are connected through a common resistance to an emitter voltage supply, the bases of which form first and second inputs, respectively, and the collector of the first forms the output, a DC reference voltage source, means connecting the DC reference voltage from said DC reference voltage source across the inputs, means connecting the sensed AC control voltage frequency to the first input, whereby only the portion of the AC control voltage frequency that exceeds the reference voltage will be amplified to produce an error signal at the collector of the first transistor, and means for applying the error signal to the amplifier and means in said amplifier for varying the gain thereof responsive to said error signal in a direction tending to maintain the amplitude of the AC control voltage frequency in the output at a constant level, whereby the gain of the amplifier will be inversely proportional to the amplitude of the AC control voltage.

4. A system as defined in claim 2 wherein:

the common resistance includes a photoresponsive resistance for causing the gain of the difference pair amplifier to automatically decrease as the amplitude of the A.C. control voltage frequency applied to the amplifier increases.

References Cited

UNITED STATES PATENTS

| | | | |
|---|---|---|---|
| 2,723,387 | 11/1955 | Slavin | 340—15.5 |
| 2,838,742 | 6/1958 | McManis | 340—15.5 |
| 3,048,817 | 8/1962 | Greening | 340—15.5 |
| 3,147,459 | 9/1964 | McCarter | 330—132 X |

NATHAN KAUFMAN, *Acting Primary Examiner.*

ROY LAKE, *Examiner.*

J. MULLINS, *Assistant Examiner.*